United States Patent [19]

Kurihara et al.

[11] 4,361,894
[45] Nov. 30, 1982

[54] BAND-PASS FILTER CIRCUIT

[75] Inventors: Hiroshi Kurihara, Tokyo; Tadayoshi Katoh, Kawasaki, both of Japan

[73] Assignee: Fujitsu Limited, Kanagawa, Japan

[21] Appl. No.: 179,193

[22] Filed: Aug. 18, 1980

Related U.S. Application Data

[63] Continuation of Ser. No. 6,234, Jan. 24, 1979, abandoned.

[30] Foreign Application Priority Data

Jan. 26, 1978 [JP] Japan ................................. 53-7490

[51] Int. Cl.³ .................... H03D 3/06; H04L 27/22
[52] U.S. Cl. .................... 375/80; 329/110; 329/122; 333/17 R; 375/81; 375/86
[58] Field of Search ............ 455/20, 22, 123, 206, 455/208, 209, 260, 314, 315, 316; 333/17 R, 17 M, 173, 175; 375/80, 86, 81; 329/110, 122, 139, 153, 154; 307/234, 236; 328/133, 167

[56] References Cited

U.S. PATENT DOCUMENTS

| | | | |
|---|---|---|---|
| 2,339,633 | 1/1944 | Gilman | 455/39 |
| 2,976,408 | 3/1961 | Colaguori | 333/17 |
| 3,217,259 | 11/1965 | Kotzebue et al. | 455/314 |
| 3,278,685 | 10/1966 | Harper | 307/234 |
| 3,281,534 | 10/1966 | Dersch | 307/236 |
| 3,588,752 | 6/1971 | Hirshfield | 333/17 |
| 3,718,909 | 2/1973 | Greatbatch | 340/167 A |
| 4,103,244 | 7/1978 | Tan | 329/122 |
| 4,135,164 | 1/1979 | Kurata | 329/122 |

Primary Examiner—Benedict V. Safourek
Attorney, Agent, or Firm—Staas & Halsey

[57] ABSTRACT

A band-pass filter circuit comprising a band-pass filter for removing noise modulation components from an input signal comprising a carrier sine wave, a phase detector for detecting a phase difference between input and output signals of the band-pass filter, a loop filter supplied with the output from the phase detector, and automatic control means for effecting control by the output from the loop filter so that a difference between the frequency of the input sine wave and the center frequency of the band-pass filter is reduced to zero. For carrier recovery in a burst mode, the loop filter is selected for each particular case so that high-speed pulling-in is possible even if a narrow-band filter is employed as the band-pass filter for the removal of noise components. Also, high-speed and high-precision pulling-in is achieved when many bursts of different frequencies are applied in one frame period. Further, when common and individual frequency variations occur at the same time, high-speed pulling-in is also achieved for each burst.

6 Claims, 23 Drawing Figures

BAND-PASS FILTER CIRCUIT

This is a continuation, of application Ser. No. 6,234 filed Jan. 24, 1979, now abandoned.

BACKGROUND OF THE INVENTION

1. Field of the Invention

This invention relates to a tracking type band-pass filter circuit, and more particularly to improvements in the tracking type band-pass filter circuit operating in a burst mode.

2. Description of the Prior Art

Heretofore, this kind of circuit has widely been employed in a carrier recovery circuit of a demodulator circuit of a digital satellite communication system or the like.

For example, in a 4-phase PSK (Phase Shift Keying) system, modulation is removed by a suitable method from a received modulated wave to obtain a sine wave. This is achieved, for instance, by a method of multiplying the modulated wave four times, a method of using remodulation technique or the like. The sine wave thus obtained contains noise components and, to remove them, the sine wave must be applied to a narrow band-pass filter.

However, the input frequency to the carrier recovery circuit usually fluctuates and this fluctuation sometimes exceeds the band width of a band-pass filter necessary for removing the noise. In such a case, it is desirable to achieve some control to reduce the difference between the input frequency and the center frequency of the band-pass filter to zero so that the input frequency and the center frequency of the pass band agree with each other.

Figure 1A:
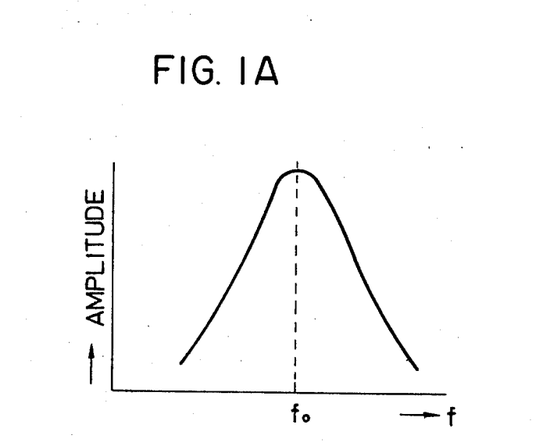
FIGS. 1A and 1B are graphs respectively showing the amplitude and the phase characteristic of a narrow band-pass filter.
Figure 1B:
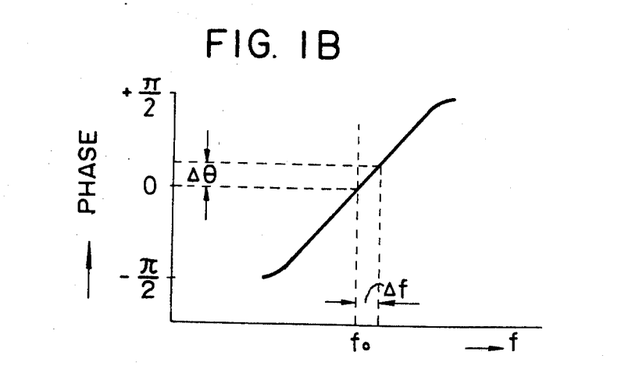

In general, a narrow band-pass filter has the characteristics as shown in FIGS. 1A and 1B. FIG. 1A shows the amplitude characteristic and FIG. 1B the phase characteristic of a typical narrow band-pass filter. The narrow band-pass filter has, in the vicinity of the center frequency $f_0$ of the pass band, a linear characteristic as shown in FIG. 1B in which it presents a substantially constant phase variation $\Delta\theta$ in response to a frequency fluctuation $\Delta f$. By making use of this property, it is possible to detect from the phase difference between the input to the narrow band-pass filter and the output therefrom whether or not the input frequency of the filter is in agreement with the center frequency of the pass band. Further, by the arrangement of a feedback control system for reducing the phase difference to zero at all times, the center frequency of the narrow band-pass filter and the input frequency can be controlled to always agree with each other.

The tracking type band-pass filter circuit is based on the above principle and may comprise either an AFC or an APC system which employ different control systems.

Figure 2:
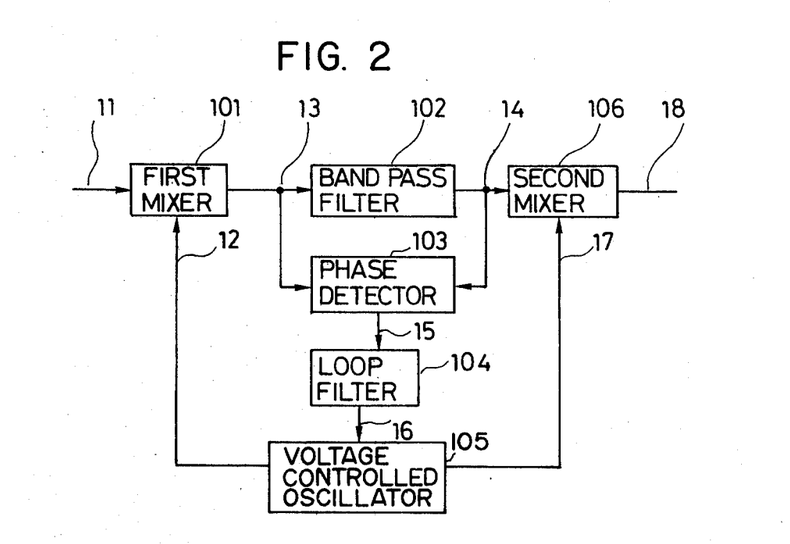
FIG. 2 is a block diagram illustrating the principal structure of an example of a tracking type band-pass filter circuit of the AFC system.

FIG. 2 illustrates in block form the principal part of an embodiment of the tracking type band-pass filter circuit of the AFC system. FIG. 2 indicates a sine-wave input 11, a first mixer 101, a band-pas filter 102, a phase detector 103, a loop filter 104, a voltage controlled oscillator (hereinafter referred to as the VCO) 105, and a second mixer 106. Briefly stated, the operation of the circuit depicted in FIG. 2 is as follows. The sine-wave input 11 is frequency converted by the first mixer 101 and then applied to the band-pass filter 102 to remove noise components. If the frequency f of the input sine wave at a connection point 13 differs from the center frequency $f_0$ of the band-pass filter 102, a phase difference occurs between the connection points 13 and 14 corresponding to the frequency difference. But by an automatic frequency control (AFC) circuit made up of the phase detector 103, the loop filter 104 and the VCO 105, the VCO oscillation frequency is controlled so that the output voltage from the phase detector 103 may approach zero, and as a consequence, the phase difference resulting from the frequency difference is eliminated; therefore a carrier with no phase error is recovered.

Figure 3:
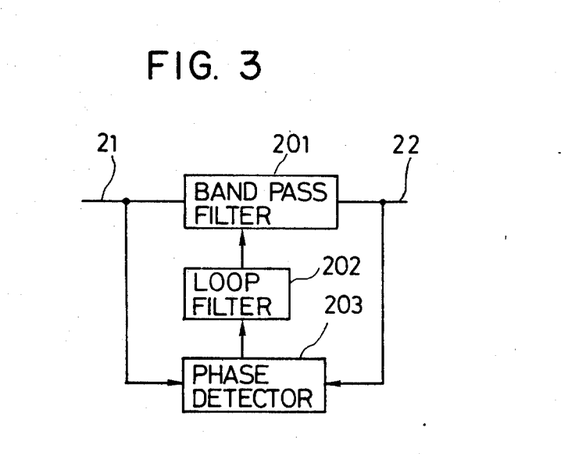
FIG. 3 is a block diagram illustrating the principal structure of an example of a tracking type band-pass filter circuit of the APC system.

FIG. 3 shows in block form the principal part of an embodiment of the tracking type band-pass filter circuit of the APC system. FIG. 3 indicates a sine-wave input 21, a band-pass filter 201, a loop filter 202, a phase detector 203, a carrier output 22. Briefly stated, the operation of the circuit of FIG. 3 is as follows. The input sine wave 21 is applied to the band-pass filter 201 whose center frequency is variable and in which noise components are removed from the input to provide the carrier output 22. If the frequency of the input sine wave 21 differs from the center frequency $f_0$ of the band-pass filter 201, a phase difference occurs between the input 21 and the output 22 in accordance with the frequency difference therebetween. But by an automatic phase control (APC) circuit made up of the phase detector 203, the loop filter 202 and the band-pass filter 201 the center frequency of the band-pass filter 201 is so controlled as to make the output from the phase detector 203 approach zero, thereby removing the phase difference based on the frequency difference to recover a carrier with no phase error.

Figure 4A:
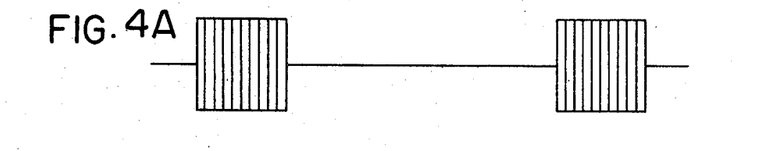
FIGS. 4A through 4D show variations in the amplitude wave form of a burst and a control voltage of an AFC circuit.

When the tracking type band-pass filter circuit is actuated in a burst mode, the input to the band-pass filter, for example, the signal waveform at the connection point 13 in FIG. 2, becomes a discontinuous sine wave as shown in FIG. 4A. Accordingly, in consideration of the transient response characteristic from the OFF state of the sine wave to the ON state, the tracking type band-pass filter must be designed so that it reaches its steady state rapidly. The time until the phase error of the recovered carrier becomes smaller than a certain allowable value after the start of a burst is defined as the pull-in time $t_q$. The time $t_q$ is dependent upon the bandwith B of the band-pass filter and, to reduce the time $t_q$, the band width B must be increased. This is well-known in the art. For increasing the attenuation of the noise components of the input signal, the band width B must be decreased. The high-speed pulling-in and the noise removal are contradictory to each other.

The relationship between the charging and discharging time constants of the loop filter and the pull-in time in the circuit of FIG. 3 is discussed next. Letting $\phi$ represent the phase difference between the signals at the connection points 13 and 14 or the phase error of the recovered carrier, the phase difference or error is in proportion to a difference $f-f_0$ between the frequency f of the input sine wave at the connection point 13 and the center frequency $f_0$ of the band-pass filter 102 in FIG. 2. A control voltage of the VCO 105 in FIG. 2 (whose voltage will hereinafter be referred to simply as the control voltage) is made substantially proportional to the phase difference or error $\phi$ within an operating range of the circuit. If the control voltage immediately before the burst starts is taken as $v_1$, and if the feedback loop system is assumed to have reached its steady state at the moment of termination of the burst and if the control voltage at that moment is taken as $v_2$, the difference, $v-v_2$ between the control voltage $v$ at an arbitrary moment in the burst and the control voltage $v_2$ is proportional to $\Delta V = v_2 - v_1$. From the above, it is seen that the difference, $\phi - \phi_2$ between the phase $\phi_2$ in the steady state and the phase $\phi$ at an arbitrary moment in the burst is in proportion to $\Delta V = v_2 - v_1$. On the other hand it is evident, from the above definition of the pull-in time $t_q$, that the smaller is the difference $\phi - \phi_2$ at a certain moment and consequently the smaller the difference $\Delta V = v_2 - v_1$, the shorter the time $t_q$ becomes.

Figure 5A:
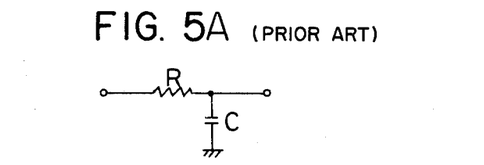
FIG. 5A is a circuit diagram illustrating the construction of a conventional loop filter.

As such a loop filter, there has heretofore been employed a simple RC circuit as shown in FIG. 5A. If the time constant of this circuit is determined from the condition that its output should reache its steady state by the end of the burst, the variation in the output voltage after termination of the burst also has the same time constant. Accordingly, when the interval between burst is long, even if the steady-state value is reached by a burst signal input, it is discharged before the next burst input is applied, so that charging must start with the initial state in response to the next burst input, and consequently the control voltage difference $\Delta V$ cannot be reduced. An increase in the discharge time constant causes an increase in the charge time constant, too, making it impossible to reach the steady state by the end of the burst. As a consequence, in the conventional tracking type band-pass filter circuit, it is impossible to sufficiently shorten the pull-in time $t_q$ and achieve the high-speed pulling-in by a narrow band-pass filter.

Figure 5B:
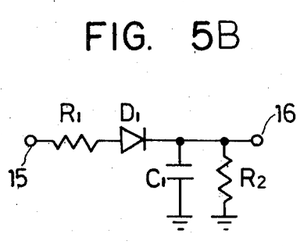
FIGS. 5B and 5C are circuit diagrams showing embodiments of a loop filter according to the present invention.
Figure 5C:
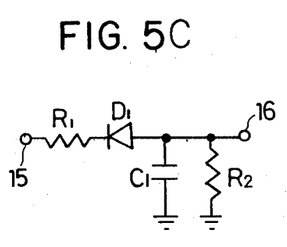

In the above description, the control voltage is desired to be made small on the assumption that bursts of the same frequency occur. This case can be dealt with by the use of the loop filter of this invention as shown in FIG. 5B or 5C. However, it is necessary to reduce the control voltage fluctuation not only in such a case but also in the case of a frequency deviation between bursts. In the latter case, it is desirable to minimize the absolute value of the voltage V at the connection point 15 in FIG. 2 with respect to all of the bursts. Since the voltage V is in proportion to the difference between the frequency f of the burst at the connection point 13 and the center frequency $f_0$ of the filter 102 in FIG. 2, as described to previously, it is possible to put $V = A(f - f_0)$ where A is a proportional constant. Let the maximum and minimum frequencies of the bursts be represented by $f_{max}$ and $f_{min}$, respectively. In the case of using the loop filter shown in FIG. 5B, the input voltage is effective only in the positive polarity, so that to obtain $V \geq 0$ with respect to all the bursts, it is necessary that $$A(f_{max} - f_0) \geq 0 \qquad (1)$$

$$A(f_{min} - f_0) \geq 0 \qquad (2)$$

Therefore, a maximum value $|V|$max of $|V|$ is given as follows:
$$|V|\max = |A|(f_{max} - f_{min}) \qquad (3)$$

Also in the case of employing the loop filter shown in FIG. 5C, the maximum value $|V|$max is likewise given by the equation (3) for actuating the filter at $V \leq 0$. If there are no such limitations as represented by either of the equations (1) and (2), it is possible to obtain $$|V|\max = |A|(f_{max} - f_{min})/2 \qquad (4)$$

by selecting parameters so that $f_{max} + f_{min} = 2f_0$. The value given by the equation (4) is half the value of that of equation (3); this is advantageous from the viewpoint of high-speed pulling-in.

Such a method is effective in the TDMA (time division multiplex access) system in which burst signals of different frequencies are input from many stations in one frame period. With the said conventional loop filter, abovesaid effect is not obtained; therefore, the high-speed pulling-in is difficult.

The two methods referred to above are characterized by the use of a loop filter by which the burst voltage is retained (or prevented from rapid attenuation) even after a burst is over, so as to reduce the fluctuation of a control voltage of the AFC circuit. With such an arrangement, however, since tracking of the burst is inevitably affected by an immediately preceding one, the phase difference between the bursts is large when their frequency deviation is large. This invention is intended to eliminate frequency fluctuations of individual bursts by achieving high-speed and high-precision pulling-in even in the case of a large frequency deviation between successive bursts.

This is required, for example, in a satellite communication system in which one satellite station is shared by many earth stations. In the satellite communication system, the frequency fluctuation of the burst signal fall in two classes: one is called an individual frequency fluctuation, which is a frequency fluctuation of each earth station relative to the others owing to differences in the transmitting frequency among the earth stations and the other is a frequency fluctuation resulting from a frequency conversion by a relay station (a satellite transponder in the satellite communication). The latter is common to all bursts of the respective earth stations and hence is called a common frequency fluctuation. In many cases, the common frequency fluctuation is larger than the individual frequency fluctuation. The individual frequency fluctuation occurs instantaneously for each burst, whereas the common frequency fluctuation results mainly from a secular variation of the relay station and hence is far slow compared with the individual frequency variation.

In the past, the tracking type band-pass filter circuits of this kind have been mostly designed without consideration of the distinction between such two frequency fluctuations. In such a case, operating regions such as a pull-in frequency range and so on are limited so as to enable quick pulling-in in response to all frequency fluctuations. With such conventional tracking type band-pass filter circuits, it is impossible to operate satisfactorily for both of a very gentle fluctuation (the common frequency fluctuation) and a quick fluctuation (the individual frequency fluctuation).

To overcome such a defect of the prior art, a method of controlling the control voltage of the AFC circuit by changing over the voltage with a switch in accordance with the presence or absence of a burst has been proposed in U.S. Pat. No. 3,969,678 filed July 3, 1975, entitled "Band Pass Filter Circuit with Automatic Bandwidth Adjust", assigned to the same assignee of the present application. However, this method has the disadvantages of having a complicated circuit structure because of the use of a burst detector, of having the possibility of a malfunction in a poor C/N state, and of a time lag in the operation of the switch.

SUMMARY OF THE INVENTION

An object of this invention is to provide a tracking type band-pass filter circuit which enables high-speed pulling-in by the employment of a loop filter capable of reducing the aforementioned voltage difference ΔV.

Another object of this invention is to provide a tracking type band-pass filter circuit which achieves high-speed pulling-in for each burst even when many burst signals of different frequencies are input in one frame period.

Still another object of this invention is to provide a tracking type band-pass filter circuit which is simple and free from malfunction and which is capable of actuating a band-pass filter without burst detection and enables high-speed pulling-in for each burst even if both the common frequency fluctuation and the individual frequency fluctuation exist at the same time.

The above objective can be achieved by providing a band-pass filter circuit of this invention which comprises a band-pass filter for removing noise components from an input sine wave, a phase detector for detecting the phase difference between input and output signals of the band-pass filter, a loop filter supplied with the output from the phase detector and automatic control means for effecting control by the output from the loop filter so that the difference between the frequency of the input sine wave and the center frequency of the band-pass filter approaches zero and in which the loop filter is a low-pass filter having a discharge time constant larger than a charge time constant.

DESCRIPTION OF THE PREFERRED EMBODIMENTS

Figure 4B:
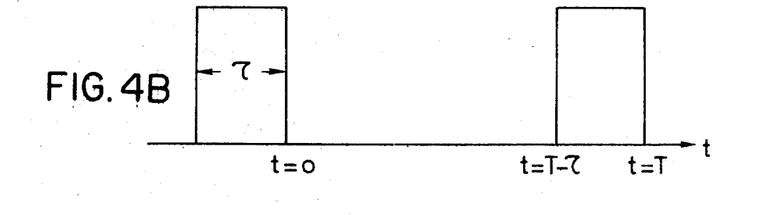
Figure 4C:
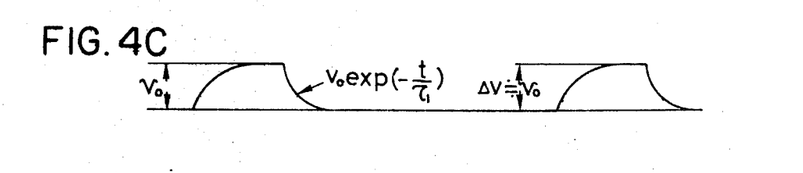
Figure 4D:
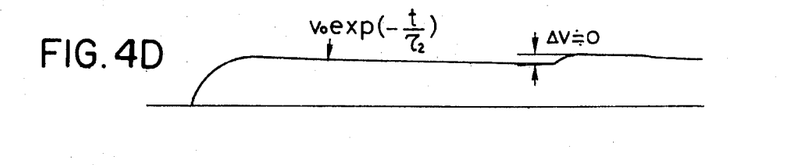

FIGS. 5B and 5C respectively show embodiments of loop filters for use in the band-pass filter circuit. The loop filter shown in FIG. 5B is suitable for use in achieving the first one of the aforesaid objects of this invention, namely, high speed pull-in. The loop filters of FIGS. 5B and 5C are respectively operative with a positive and a negative input voltage. Now, the operations of the loop filters depicted in FIGS. 5B and 5C will be described. Let it be assumed that the impedance of the input side of each loop filter is zero and that the impedance of the output side is sufficiently large. Assuming that the forward resistance and the backward resistance of each diode $D_1$ are zero and sufficiently large, respectively, then the charge time constant $\tau_1$ and the discharge time constant $\tau_2$ are $R_1R_2C/(R_1+R_2)$ and $R_2C$, respectively. Then, by selecting the resistance values $R_1$ and $R_2$ so that $R_2>>R_1$, the discharge time constant $\tau_2$ is made sufficiently larger than the charge time $\tau_1$. Referring next to FIGS. 4A and 4B, a description will be given of how the control voltage fluctuation ΔV is reduced by making the discharge time constant $\tau_2$ sufficiently larger than the charge time constant $\tau_1$. FIG. 4A shows the input waveform at the connection point 13 in FIG. 2. If the phase detector 103 is adjusted so that when the frequency f of the input wave differs from the center frequency $f_0$ of the filter 102, a voltage proportional to the difference $f-f_0$ appears at the connection point 15, this voltage varies, as shown in FIG. 4B, in the case where the AFC circuit is inoperative. Where the AFC circuit is operative, feedback control is effected so that the control voltage always approaches zero, but it is not completely reduced to zero and, as will be described later on, varies as a steady-state error, as illustrated in FIG. 4C or 4D. A discussion will be made of the variation in the control voltage appearing at the connection point 16 in FIG. 2, assuming, for convenience of description, that bursts of a constant frequency appear at a constant interval T. Let the burst length, the charge time constant of the loop filter and its discharge time constant be represented by $\tau$, $\tau_1$ and $\tau_2$, respectively. If the charge time constant $\tau_1$ is selected so that the control voltage reaches its steady state $v_0$ within the time corresponding to the burst length, the control voltage available immediately before the beginning of a burst is obtained from the characteristics of discharge starting upon termination of the immediately preceding burst as follows:

$$V = v_0 \exp(-T-\tau/\tau_2) \quad (5)$$

Accordingly, the voltage change ΔV in the time T− is given as follows:

$$\Delta V = v_0 \{1 - \exp(-T - \tau/\tau_2)\} \quad (6)$$

In the conventional circuit, since the charge time constant $\tau_1$ is selected so that the control voltage reaches its steady state within the time corresponding to the burst length $\tau$, as referred to above, and since the charge and discharge time constants $\tau_1$ and $\tau_2$ are equal to each other, it follows that $(T-\tau)/\tau_2 >> 1$ when the burst length is very much smaller than the frame length T. Therefore, from the equation (6), it follows that $\Delta V = v_0$, but this means that the control voltage variation is always $v_0$ because the control voltage charged by the immediately preceding burst is discharged before the next burst starts, as shown in FIG. 4C. With the use of the loop filter by which the discharge time constant $\tau_2$ can be selected independently of the charge time constant $\tau_1$ according to this invention, it is possible to obtain that $(T-\tau)/\tau_2 << 1$; therefore, it follows from the equation (6) that $\Delta = 0$. Thus, with this invention, the control voltage fluctuation between bursts can be reduced, as depicted in FIG. 4D, so that the pull-in time can be shortened for the aforesaid reason.

Figure 6:
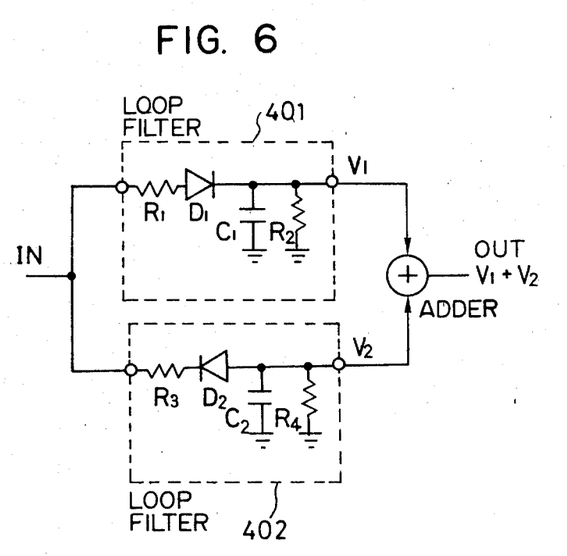
FIG. 6 is a circuit diagram illustrating a modified form of the loop filter in this invention.

FIG. 6 is a circuit diagram illustrating another embodiment of the loop filter for use in the band-pass filter circuit of this invention. The illustrated loop filter is suitable for use in achieving the second one of the aforementioned objects of this invention, namely high speed pulling in with bursts of different frequencies; and provides the value $|V|$ max by the equation (4) without such limitations as given by the equations (1) and (2).

The circuit shown in FIG. 6 comprises a loop filter 401 operative on a positive voltage and a loop filter 402 operative with a negative voltage and is characterized in that the AFC circuit is controlled by the sum, $V_1 + V_2$, of the outputs $V_1$ and $V_2$ from the two loop filters 401 and 402. The operation of the circuit shown in FIG. 6 is as follows. Where the input voltage at the input terminal IN is positive, a capacitor $C_1$ is charged via a resistor $R_1$ and a diode $D_1$ and discharged via a resistor $R_2$ when the input becomes zero upon completion of the burst. In this case, the control voltage fluctuation can be reduced by selecting the charge and discharge time constants $\tau_1$ and $\tau_2$ so that $\tau_1 << \tau_2$, as described previously. Since the loop filter 402 does not operate on a positive voltage, any charge that may have been stored in the capacitor $C_2$ is discharged via a diode $D_2$ and a resistor $R_3$ upon completion of the burst, resulting in the output $V_2$ from the loop filter 402 becoming zero. This voltage is not affected by the interruption of the burst. The circuit of FIG. 6 is so arranged as to derive at its output terminal OUT the sum, $V_1 + V_2$, of the outputs $V_1$ and $V_2$ from the both loop filters 401 and 402, so that $V_1 + V_2 = V_1$, and consequently a maximum charge voltage corresponding to a burst with a larger frequency deviation than any other bursts would appear at the output in response to such a maximum frequency burst. In this case, the pull-in time becomes short, as described previously. Where a negative voltage has been applied to the input terminal IN, it is retained as the output $V_2$ and the voltage $V_1$ becomes zero, providing the same result as described above. As the oscillation frequency of the AFC circuit is thus controlled by the sum, $V_1 + V_2$, of the outputs $V_1$ and $V_2$ from the loop filters 401 and 402 which respectively operate on positive and negative voltages, the input voltage to the loop filter 104 of FIG. 2 may be positive or negative. Accordingly, it is possible to obtain $f_{max} + f_{min} = 2f_0$, as mentioned previously, so that even if a frequency deviation exists between bursts, the control voltage fluctuation can be made as given by the equation (4), making it possible to achieve higher-speed pulling-in than in the case of using the loop filter of FIG. 5B or 5C alone.

Figure 7:
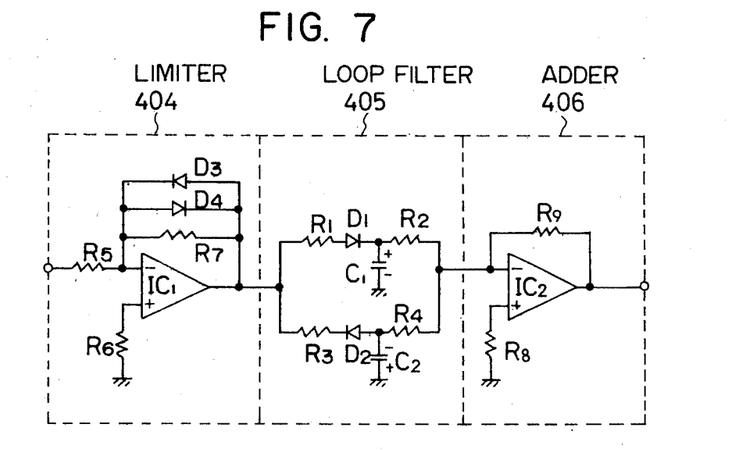
FIG. 7 is a circuit diagram showing an example of a specific operative structure of the loop filter depicted in FIG. 6.

FIG. 7 illustrates an example of a specific operative structure of the loop filter shown in FIG. 6. In FIG. 7, a circuit indicated by 405 corresponds to the loop filters 401 and 402 in FIG. 6 and a circuit 406 composed of an operational amplifier IC$_2$ and resistors R$_8$ and R$_9$ corresponds to the adder shown in FIG. 6. A circuit 404 composed of an operational amplifier IC$_1$, diodes D$_3$ and D$_4$ and resistors R$_5$, R$_6$ and R$_7$ comprises a limiter, which is provided to prevent high voltages from being charged in the capacitors C$_1$ and C$_2$ when the phase detector output varies excessively owing to malfunction.

Figure 8:
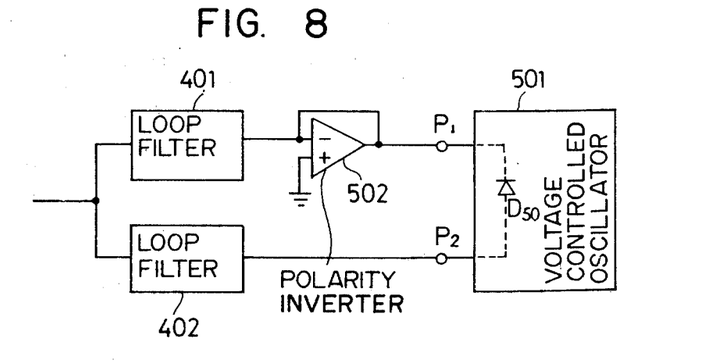
FIG. 8 is a block diagram illustrating a third embodiment of the loop filter in this invention.

FIG. 8 shows the construction of a third embodiment of the loop filter for use in the band-pass filter circuit of this invention. Also with the arrangement of FIG. 8, it is possible to obtain a loop filter which provides the value of $|V|$max as given by the equation (4). In FIG. 8, reference numerals 401 and 402 identify the same loop filters as those used in FIG. 6. In the circuit of FIG. 8, the AFC circuit is operated by inverting the output from the loop filter 401 with a polarity inverter 502 as depicted in FIG. 8, providing the difference between the inverted output and the output from the loop filter 402 and applying this difference voltage across two input terminals P$_1$ and P$_2$ of a VCO 501 comprising a variable capacity element D$_{50}$, as shown in FIG. 8.

Figure 9:
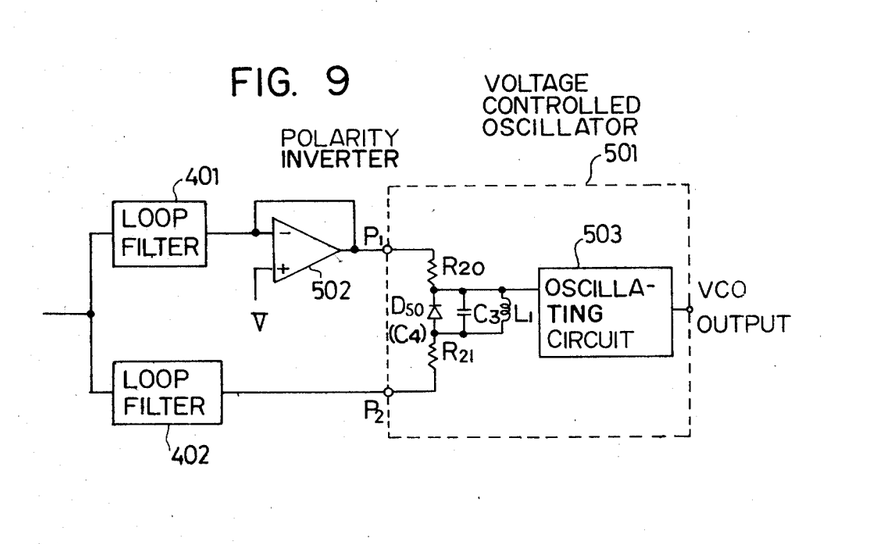
FIG. 9 is a circuit diagram showing an example of a specific operative structure of the loop filter shown in FIG. 8.

FIG. 9 illustrates an example of a specific operative structure of the circuit depicted in FIG. 8. FIG. 9 indicates the same loop filters 401 and 402 as those utilized in FIG. 6; a VCO 501; L$_1$ and an inductance L$_1$ and a capacitance C$_3$ which determine the oscillation frequency of the VCO 501; resistors R$_{20}$ and R$_{21}$ for preventing lowering the Q of the resonator composed of the inductance L$_1$ and the capacitance C$_3$. The capacitance C$_3$ has connected thereto in parallel the variable capacity element D$_{50}$. Letting its capacity be represented by C$_4$, the oscillation frequency $f_0$ is given by the following equation:

$$f_0 = \frac{1}{2\pi \sqrt{L_1(C_3 + C_4)}} \quad (7)$$

In the circuit of FIG. 9, the value of the capacity C$_4$ varies with a voltage difference between the terminals P$_1$ and P$_2$, by which the oscillation frequency $f_0$ can be altered. A voltage V applied to one of the input terminals of the polarity inverter 502 is to bias the variable capacity element D$_{50}$.

This invention has the striking feature that since the maximum control voltage is determined by a burst of maximum frequency deviation, even if the number of bursts, i.e. the burst density, in a frame length is changed, the control voltage does not fluctuate and a stable operation can be expected.

Figure 10:
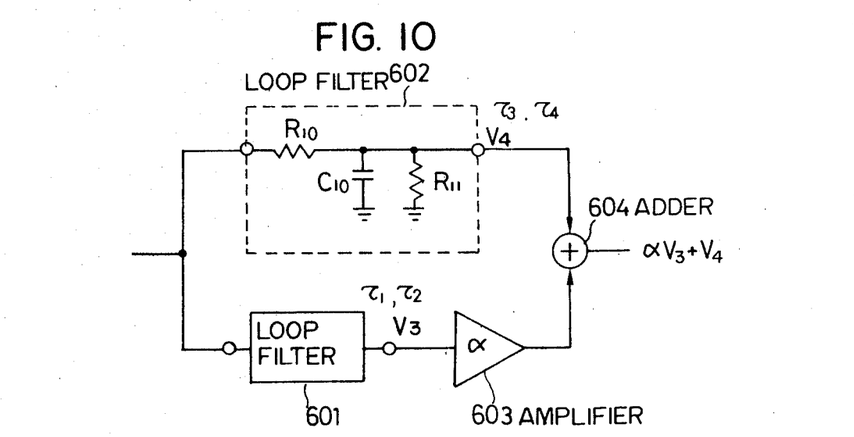
FIG. 10 is a block diagram illustrating a fourth embodiment of the loop filter in this invention.
Figure 11A:
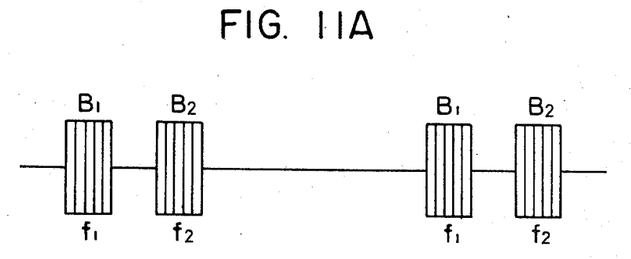
FIGS. 11A and 11B are explanatory of the operation of the loop filter shown in FIG. 10.
Figure 11B:
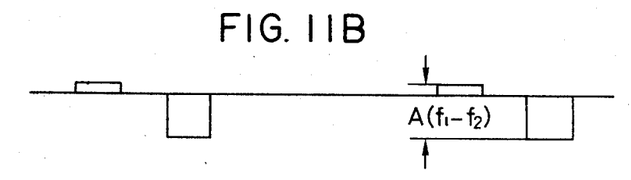

FIG. 10 shows in block form the construction of a fourth embodiment of the loop filter of this invention which is suitable for use in achieving the third one of the aforesaid objects of this invention, namely, a band-pass filter capable of actuation with high speed pull-in even with common and individual frequency fluctuations. FIGS. 11A and 11B are explanatory of its operation. Consider the case where two bursts B$_1$ and B$_2$ of different frequencies appear at a constant interval T, as shown in FIG. 11A. Let $f_1$ and $f_2$ represent the frequencies of the first and second bursts $B_1$ and $B_2$, respectively, $\tau_1$ and $\tau_2$ represent the charge and discharge time constants of a first loop filter 601, respectively, and $\tau_3$ and $\tau_4$ represent the charge and discharge time constants of a second loop filter 602, respectively. If the burst $B_1$ has the maximum frequency deviation and the AFC circuit has reached its steady state by this burst, even if the second burst $B_2$ is applied, the control voltage by the burst $B_1$ is retained (or is not rapidly attenuated), with the result that an error voltage, $v = A(f_1 - f_2)$, proportional to a frequency difference, $f_1 - f_2$, between the bursts $B_1$ and $B_2$ appears at the connection point 15 in FIG. 2. In this invention, the time constant of the second loop filter 602 is selected so that the oscillation frequency of the AFC circuit is rapidly changed also by the error voltage, and the charge and discharge time constants $\tau_1$, $\tau_2$, $\tau_3$ and $\tau_4$ are selected so that $\tau_3 < \tau_1$ and $\tau_4 < \tau_2$. Letting the output voltages from the second and first loop filters 602 and 601 be represented by $V_4$ and $V_3$, respectively, the oscillation frequency of the AFC circuit is changed by the result of forming the combined output of the outputs $V_3$ and $V_4$. In FIG. 10, there is shown an embodiment of a method in which the output $V_3$ from the first loop filter 601 is changed by a factor $\alpha$ by an amplifier (or attenuator) 603 and added to the output $V_4$ from the second filter 602. For the sake of brevity, a description will be given of the case where $\alpha = 1$. It is explained above how the voltage fluctuation $\Delta V$ from the burst $B_1$ becomes substantially equal to zero. The circuit of FIG. 10 shows the loop filter 602 to be a conventional loop filter circuit such that the control voltage $V_4$ developed during a burst B1 is discharged in the interval between bursts as illustrated in FIG. 4, and the control voltage changes from 602 alone, as a result of burst B2, would be $V = A'(f_2 - f_0)$ (where A' is a proportional constant). By contrast, with the loop filter 601 the control voltage fluctuation as a result of burst B2 would be $V = A'(f_1 - f_2)$. Generally, the individual frequency fluctuation $|f_1 - f_2|$ is smaller than the common frequency fluctuation $|f_2 = f_0|$.

Figure 12:
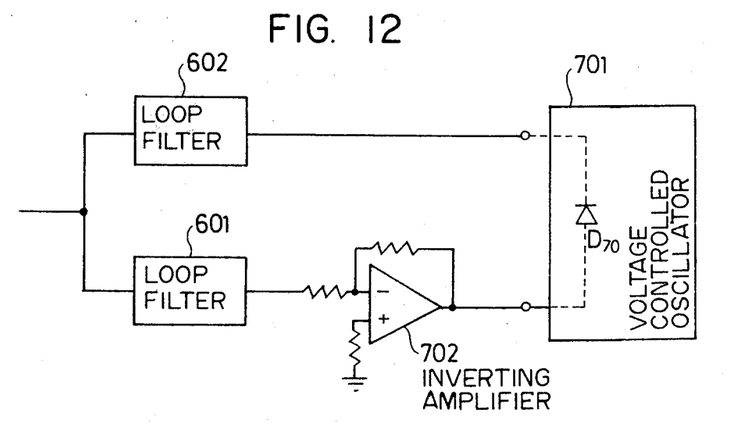
FIG. 12 is a block diagram showing the construction of a fifth embodiment of the loop filter in this invention.

Since the control voltage fluctuation resulting from use of both is smaller, high speed pull-in is achieved. Such high speed pull-in is possible not only for burst B1 having maximum frequency deviation but also for other bursts having the individual frequency fluctuation. The same result can also be obtained by replacing the adder circuit for the outputs from the two loop filters 601 and 602 as shown in FIG. 10 with the circuit arrangement as shown, for example, in FIG. 12 in which the output from the one loop filter 602 and the output from an inverting amplifier 702 having amplified the output from the other loop filter 601 are applied to a variable capacity element $D_{70}$.

Figure 13:
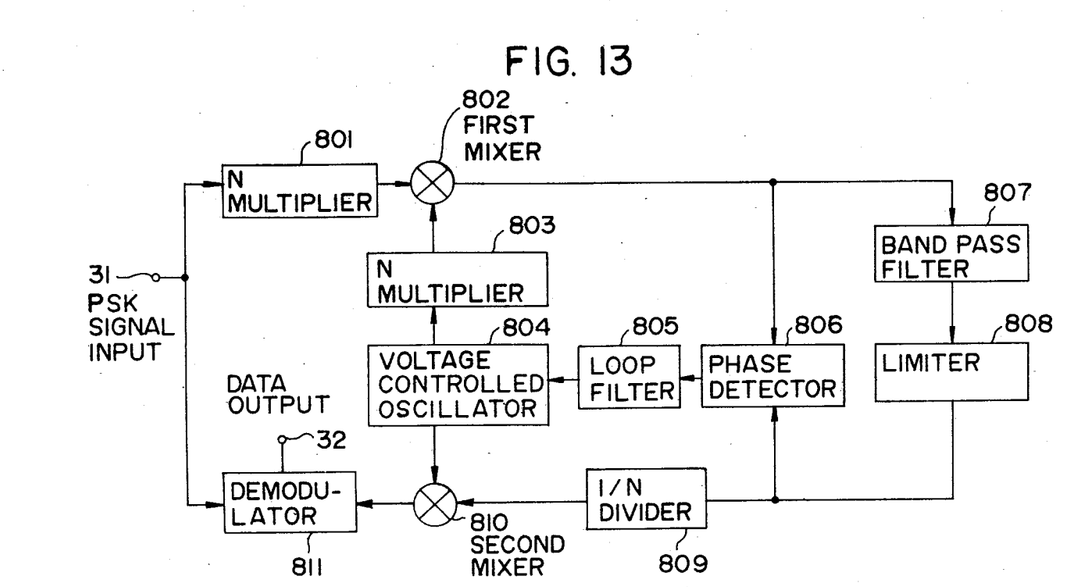
FIG. 13 is a block diagram illustrating the arrangement of a carrier recovery circuit which employs a frequency multiplication method and has an AFC loop.

FIGS. 13 to 16 are block diagrams illustrating in block form other embodiments of the band-pass filter circuit of this invention. FIG. 13 shows the construction of a carrier recovery circuit which employs an N-multiplication method for removing modulation from an input modulated wave and causes the input frequency to track the center frequency of the pass band of a band-pass filter by the AFC system.

In FIG. 13, a PSK modulated signal applied to an input terminal 31 is N multiplied by an N multiplier 801 to remove the PSK modulation. An output signal of a voltage controlled oscillator 804 is also N multiplied by an N multiplier 803. The output signals of the both N multipliers 801 and 803 are mixed together by a first mixer 802, the output signal of which is applied to a band-pass filter 807. The output from the band-pass filter 807 is applied to a limiter 808 for removing amplitude components, and then provided to a phase detector 806 for phase comparison with the input signal to the band-pass filter 807, producing an output corresponding to the phase difference between both signals. The phase detector output is provided via a loop filter 805 to the VCO 804 to control it. In this manner, the output frequency of the VCO 804 is controlled so that the output from the phase detector 806 approaches zero, that is, the difference between the input frequency of the band-pass filter 807 and the center frequency of its pass band approaches zero. It is needless to say that any one of the aforesaid loop filters is used as the loop filter 805 in accordance with the purpose to be achieved.

The output signal of the limiter 808 is frequency divided by a 1/N frequency divider 809 down to 1/N and then supplied to one input of a second mixer 810. The output signal of the VCO 804 is provided to the other input of the second mixer 810 in which it is frequency converted to derive at the output of the mixer 810 a carrier. The carrier thus recovered is applied to one input of a demodulator 811 to demodulate a PSK modulated input signal supplied to the other input to derive a data output at its output terminal 32.

The arrangement of the tracking type band-pass filter for removing modulation from the PSK modulated wave by N multiplying it is disclosed in the aforementioned U.S. Pat. No. 3,969,676. But the circuit arrangement set forth in this prior application is different from the abovesaid arrangement in that a 1/N frequency divider is provided between the VCO 804 and the mixer 810 in place of the N multiplier 803.

Figure 14:
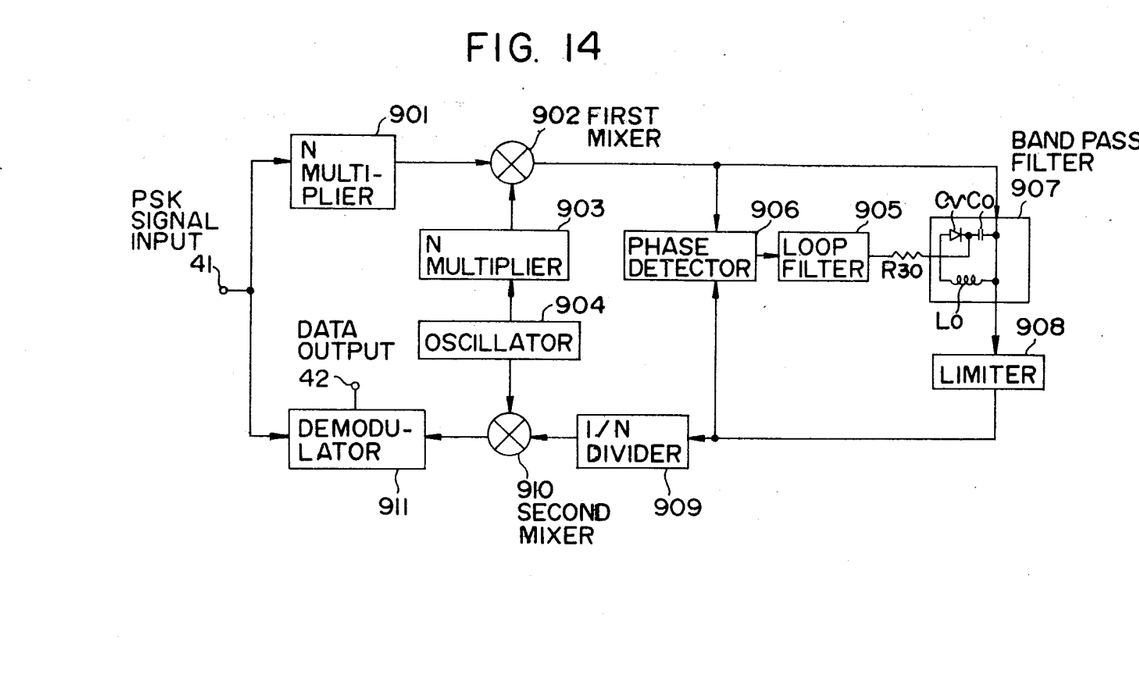
FIG. 14 is a block diagram showing the arrangement of a carrier recovery circuit which adopts the frequency multiplication method and has an APC loop.

FIG. 14 illustrates the construction of a carrier recovery circuit in which modulation is removed from a modulated wave by N multiplying it and then the center frequency of the band-pass filter is caused to track the input frequency by the APC system.

In FIG. 14, the output from an N multiplier 901 is provided to a first mixer 902 and then frequency converted by a signal derived from an N multiplier 903 having N multiplied the output from a fixed oscillator 904. The output from the first mixer 902 is applied to a variable band-pass filter 907, the output of which is provided to a limiter 908 for removal of its amplitude components. The limiter output is supplied to one input of a phase detector 906 for phase comparison with the input signal to the variable band-pass filter 907. The output from the phase detector 906 is applied via a loop filter 905 to the band-pass filter 907 to control its variable capacity element Cv. The variable capacity element Cv makes up a band-pass filter 907 together with a fixed capacitance Co and an inductance Lo. The center frequency of the band-pass filter 907 is controlled so that the output from the phase detector 906 approaches zero, that is, the difference between the input frequency and the center frequency of the pass band approaches zero. Reference character $R_{30}$ identifies a resistor for preventing lowering the Q of the variable band-pass filter 907. As is the case with FIG. 13, the loop filter 905 can be selected from the aforementioned ones.

The output from the limiter 908 is frequency divided by a 1/N frequency divider 909 down to 1/N and then provided to a second mixer 910 to frequency convert the output from the fixed oscillator 904, thereby deriving a carrier at the output of the second mixer 910.

Figure 15:
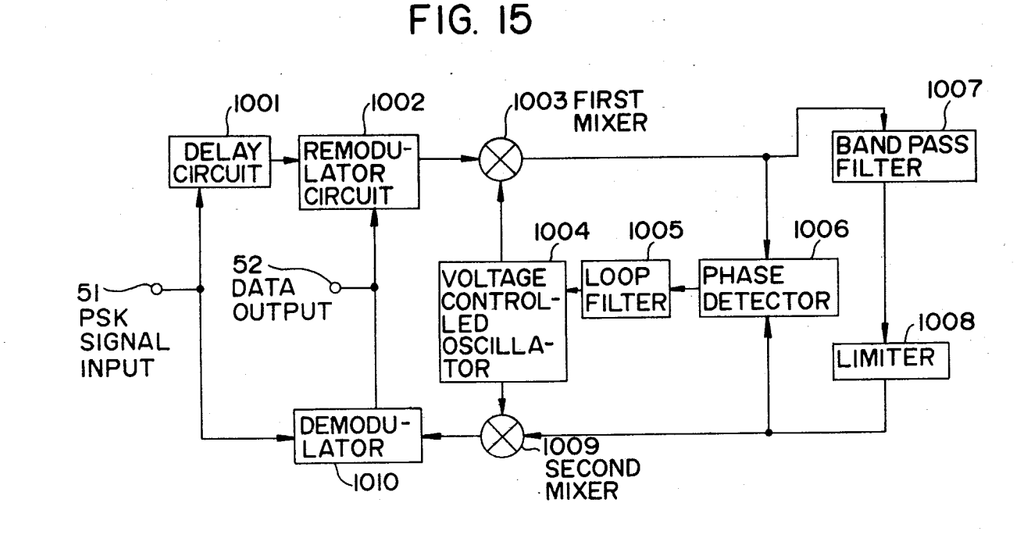
FIG. 15 is a block diagram illustrating the arrangement of a carrier recovery circuit which uses a re-modulation method and has an AFC loop.

FIG. 15 shows the construction of a carrier recovery circuit in which modulation is removed by re-modulation from a modulated wave and then the input frequency is caused to track the center frequency of the pass-band of a band-pass filter by the AFC system.

In FIG. 15, a PSK modulated input at a terminal 51 is delayed by a delay circuit 1001 for a certain period of time and then applied to a re-modulator 1002 in which it is re-modulated by the data output from a demodulator 1010. thereby removing the modulation. The output signal of the re-modulator 1002 is provided to a first mixer 1003 in which it is subjected to automatic control for frequency conversion so that the frequency of the input signal to a band-pass filter 1007 approaches the center frequency of its pass band, by which a carrier is recovered at the output of a second mixer 1009, as is the case with FIG. 2. The delay circuit 1001 is provided to compensate for a delay in the data output from the demodulator 1010.

Figure 16:
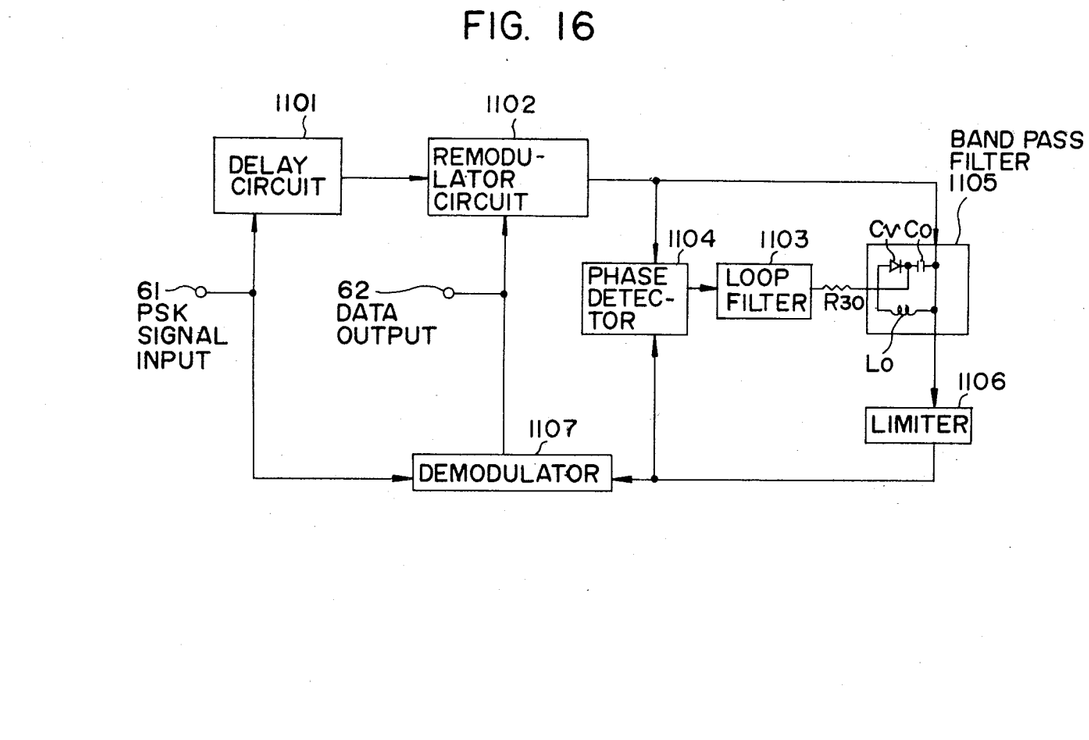
FIG. 16 is a block diagram showing the arrangement of a carrier recovery circuit which utilizes the re-modulation method and has an APC loop.

FIG. 16 illustrates the circuit arrangement in which modulation is removed by re-modulation from a modulated wave and then the center frequency of the pass band of a band-pass filter is caused to track the input frequency by the APC system.

In FIG. 16, a delay circuit 1101 and a re-modulator 1102 are identical with those described above with respect to FIG. 15. It is also the same as in the case of FIG. 14 in that the band-pass filter 1105 is controlled by the output from a phase detector 1104 so that its center frequency approaches to the frequency of an input signal from a re-modulator 1102.

As is evident from the foregoing description, this invention provides not only a tracking type band-pass filter circuit which enables high-speed pulling-in but also a tracking type band-pass filter circuit by which even if many burst signals of different frequencies are applied in one frame period, optimum control can be achieved in accordance with the frequency of each station. With this invention, it is also possible to provide a tracking type band-pass filter circuit which is capable of achieving optimum control for each of the common frequency fluctuation and the individual frequency fluctuation when they occur at the same time and which is simple in circuit construction and free from malfunction.

It will be apparent that many modifications and variations may be effected without departing from the scope of novel concepts of this invention.

What is claimed is:

1. A band-pass filter circuit for carrier recovery from bursts of phase shift keyed information from at least one transmitting source, each said transmitting source transmitting at most one of said bursts per frame period, said circuit comprising a band-pass filter for removing noise components from an input sine wave corresponding to the for each said burst, a phase detector for detecting a phase difference between input and output signals of the band-pass filter, a loop filter supplied with the output from the phase detector, and automatic control means for effecting control by the output from the loop filter so that the difference between the frequency of the input sine wave and the center frequency of the band-pass filter approaches zero, wherein the loop filter comprises a low-pass filter having a charge time constant smaller than the length of each said burst and a discharge time constant larger than the frame period.

2. The circuit of claim 1, wherein the loop filter comprises a parallel connection of a first low-pass filter operative with a positive input voltage and having a charge time constant smaller than the burst length and a discharge time constant larger than a frame period and a second low-pass filter operative with a negative input voltage and having a charge time constant smaller than the burst length and a discharge time constant larger than the frame period and means for adding outputs from the first and second low-pass filters to provide said output to said automatic control means.

3. The circuit of claim 2, wherein the loop filter has connected thereto in parallel a third low-pass filter having charge and discharge time constants smaller than the respective ones of the first and second low-pass filters.

4. The circuit of claim 3, comprising means for providing a weighted sum of the output of the third low-pass filter and said added outputs of the first and second low-pass filters as said output to said automatic control means.

5. The circuit of claim 1 comprising a further low-pass filter connected in parallel to said loop filter, said further low-pass filter having charge and discharge time constants that are smaller than the respective ones of said low-pass filter of said loop filter.

6. The circuit of claim 5, comprising means for providing a weighted sum of the output of said further low-pass filter and the output of the loop filter as said output to said automatic control means.

* * * * *

UNITED STATES PATENT AND TRADEMARK OFFICE
CERTIFICATE OF CORRECTION

PATENT NO. : 4,361,894
DATED     : 30 June 1983
INVENTOR(S): HIROSHI KURIHARA et al It is certified that error appears in the above-identified patent and that said Letters Patent is hereby corrected as shown below:

Front Page, [75] line 1, "Tokyo" should be --Kawasaki--;

[73] Assignee, "Kanagawa" should be --Kawasaki--;

[57] ABSTRACT, line 2, after "noise" insert --and--.

Column 1, line 61, "pas" should be --pass--.

Column 2, line 46, "with" should be --width--.

Column 3, line 2, delete ",";

line 5, delete ",";

line 15, change "reache" to --reach--;

line 44, delete "to" (first occurrence).

Column 4, at reference number 27 (the reference numbers do not correspond to the line number), change "fluctuation" to --fluctuations--;

line 42, change "slow" to --slower--;

line 50, delete "of"; change "gentle" to slow--.

Column 6, line 66, after "-" insert --τ--.

Column 7, line 19, after "Δ" insert --V--;

line 28, change "frequencies" to --individual frequency fluctuations--;

UNITED STATES PATENT AND TRADEMARK OFFICE
CERTIFICATE OF CORRECTION

PATENT NO. : 4,361,894
DATED : 30 November 1983
INVENTOR(S) : KURIHARA et al

It is certified that error appears in the above-identified patent and that said Letters Patent is hereby corrected as shown below:

|  |  |
|---|---|
| Column 8, | line 52, change "$V_1$" to --$V_{out'}$--. |
| Column 8, | line 35, delete "$L_1$ and". |
| Column 10, | line 32, change "3,969,676" to --3,969,678--. |

Signed and Sealed this

Fourteenth Day of August 1984

[SEAL]

Attest:

GERALD J. MOSSINGHOFF

Attesting Officer

Commissioner of Patents and Trademarks